United States Patent
Otsuki et al.

(10) Patent No.: US 6,366,084 B1
(45) Date of Patent: Apr. 2, 2002

(54) MAGNETIC SENSOR HAVING SOFT MAGNETIC METALLIC ELEMENT FORMED IN ZIGZAG SHAPE

(75) Inventors: Takashi Otsuki, Shiroishi; Iwao Abe, Sendai; Naoki Wakou, Sendai; Masahiro Yamaguchi, Sendai; Ken-Ichi Arai, Sendai, all of (JP)

(73) Assignee: Tokin Corporation, Miyagi (JP)

( * ) Notice: Subject to any disclaimer, the term of this patent is extended or adjusted under 35 U.S.C. 154(b) by 0 days.

(21) Appl. No.: 09/479,157

(22) Filed: Jan. 7, 2000

(30) Foreign Application Priority Data

Jan. 8, 1999 (JP) .......................... 11-003098
Jan. 18, 1999 (JP) .......................... 11-009443

(51) Int. Cl.[7] .............................................. G01R 33/02
(52) U.S. Cl. ....................................... 324/249; 324/260
(58) Field of Search ................................. 324/249, 244, 324/260, 262

(56) References Cited

U.S. PATENT DOCUMENTS

| | | | |
|---|---|---|---|
| 3,421,075 A | 1/1969 | Belson | 324/43 |
| 4,517,515 A | 5/1985 | Reinitz et al. | 324/252 |
| 5,559,433 A | * 9/1996 | Onizuka | 324/207.21 |
| 5,585,719 A | * 12/1996 | Endo et al. | 324/235 |
| 5,838,154 A | * 11/1998 | Morikawa et al. | 324/249 |
| 5,889,403 A | 3/1999 | Kawase | 324/249 |

FOREIGN PATENT DOCUMENTS

JP 60-174966 9/1985

* cited by examiner

Primary Examiner—Safet Metjahic
Assistant Examiner—Reena Aurora
(74) Attorney, Agent, or Firm—Frishauf, Holtz, Goodman, Langer & Chick, P.C.

(57) ABSTRACT

In a magnetic sensor having soft magnetic metallic elements disposed in opposite sides of a bridge circuit for sensing an external magnetic field by using a phenomenon where a skin depth of the soft magnetic metallic elements changes in dependence on a strength of the external magnetic field, each of the soft magnetic metallic elements is formed in a zigzag shape having parallel sections extending in a direction of the external magnetic field. The soft magnetic metallic element may have a multi-layer structure where soft magnetic layers are laminated with a non-magnetic insulator layer interposed therebetween.

14 Claims, 7 Drawing Sheets

MAGNETIC SENSOR HAVING SOFT MAGNETIC METALLIC ELEMENT FORMED IN ZIGZAG SHAPE

BACKGROUND OF THE INVENTION

This invention relates to a magnetic sensor for detecting a magnetic field strength of, for example, the earth's magnetism, a magnetic signal, a magnetic field caused by a current, and so on, and in particular, to a magnetic sensor using a soft magnetic metallic element having an impedance that varies by exposure to the magnetic field.

A soft magnetic element, which has a high magnetic permeability, is know to have skin effect. When an AC voltage having a relatively high frequency on the order of MHz is applied to the soft magnetic metallic element, a ski depth due to the skin effect is determined by, and is proportional to, a reciprocal of a square root of its magnetic permeability. In addition, it is also known that a magnetic permeability of a magnetic material is apparently changed by a magnetic field in which the magnetic material is exposed. This means that an impedance of the soft magnetic metallic element changes by a magnetic field strength in which the soft magnetic metallic element is exposed. Therefore, it is possible to detect an external magnetic field by applying an AC voltage to the soft magnetic element and detecting an impedance change of the soft magnetic metallic element.

A known magnetic sensor of a type using the soft magnetic metallic sensor includes a magnetic sensor module which comprises an insulator substrate and an impedance bridge formed on the insulator substrate. The impedance bridge circuit comprises a pair of soft ma in metallic film strips and a pair of non-magnetic conductive film strips formed on the insulator substrate. The pair of soft magnetic metallic film strips are disposed in opposite arms of the impedance bridge circuit and the pair of non-magnetic conductive film strips are also disposed in the other opposite arms of the impedance bridge circuit. Thus, the impedance bridge circuit has four connection points connecting between adjacent arms. A high frequency oscillator is connected across two opposite ones of the four connection points for driving the magnetic sensor. And a voltage meter is connected across the other two opposite ones of the four connection points for detecting the external magnetic field as a voltage.

The impedance of the soft magnetic metallic film strips and the non-magnetic conductor strips are prepared so that the impedance bridge circuit is balanced with a zero volt of the voltage meter in a condition when the magnetic sensor is not exposed in any external magnetic field. When the magnetic sensor or the magnetic sensor module is exposed in an external magnetic field, the impedance of the soft magnetic metallic film strips changes and the voltage meter indicates a detection voltage. Thus, the external magnetic field is detected.

The magnetic sensor of this type has a magnetic sensitivity varying with the voltage level of the high frequency driving voltage and also by the magnetic level of the magnetic field applied thereto.

In order to increase the magnetic sensitivity, it is known in the prior art that a bias coil wound on a ring bobbin is used around the sensor module for magnetically biasing the sensor module. A bias DC current is applied to the bias coil to induce a biasing magnetic field which is applied to the sensor module. The DC current usually has a constant level so as to apply to the sensor module the magnetic bias of a fixed strength value.

In order to improve linearity of the detection output or to increase the magnetic sensitivity the bias DC current is controlled by a negative feed-back loop or a positive feed-back loop, respectively. Thus, a variable magnetic biasing is carried out.

However, the use of the bias coil wound on a ring bobbin results in a large size of the magnetic sensor and a high current consumption. For example, the coil has a diameter of 10 mm and the bias DC current is about 20mA.

In order to reduce noise, it is desired that the frequency of the driving AC voltage is high such as an order of MHz to 10 MHz. On the other hand, in order to make the magnetic sensor in small size, the soft magnetic metallic film strips are desired to have a reduced width and a reduced thickness. However, the frequency of the driving AC voltage is determined by the thickness of the strip. Therefore, reduction of thickness is not desired from a viewpoint that it results to an excessive high frequency of the driving AC voltage. While, the reduction of the width size causes increase of an area of a so called returning magnetic domain in the soft magnetic metallic film strip, which results in degradation of the magnetic sensitivity. Although the area of the returning magnetic domain is decreased by reduction of the thickness of the strip, it should be avoided from the viewpoint as described above.

SUMMARY OF THE INVENTION

Therefore, it is an object of this invention to provide a magnetic sensor using the soft magnetic metallic element having an AC impedance varying with a magnetic field strength applied thereto, which is small in size and improved in magnetic sensitivity.

It is another object to provide the magnetic sensor which has a constant or fixed magnetic bias structure without use of electric current therefor.

It is still another object of this invention to provide the magnetic sensor having a variable magnetic bias structure small in size.

It is yet another object of this invention to provide the magnetic sensor wherein an external magnetic field to be detected is effectively converged onto the soft magnetic metallic elements.

It is another object of this invention to provide the magnetic sensor where the soft magnetic element is a film strip having a reduced width size without increase of the area of the returning magnetic domain and without change of the frequency of the driving AC voltage.

According to this invention, a magnetic sensor is obtained which comprises a soft magnetic metallic element having impedance varying by exposure to an external magnetic field to be sensed, wherein said soft magnetic metallic element is formed in a zigzag shape.

In an aspect of this invention, the soft magnetic metallic element comprises a plurality of soft magnetic metallic strips equi-spacedly arranged in parallel with each other, and non-magnetic conductor pieces connecting adjacent ones of the soft magnetic metallic strips, respectively, to form a series connection of the soft magnetic metallic strips and the non-conductor metallic pieces alternately connected in the zigzag shape.

In an embodiment of this invention, the magnetic sensor comprises an impedance bridge circuit, the impedance bridge circuit comprising: first and second non-magnetic electro-conductive elements extending in a first direction and arranged in parallel with each other; first and second soft magnetic metallic elements extending in a second direction generally perpendicular to the first direction and arranged in parallel with each other to connect the first and second non-magnetic electro-conductive elements to each other at opposite ends, respectively, so that the first and second non-magnetic elements and the first and second soft magnetic elements form a rectangle having four connection points at the opposite ends, each of the first and second soft magnetic metallic elements being formed in the zigzag shape; two input terminals disposed at two diametrically opposite ones of the four connection points for applying an AC input voltage for driving the sensor; and two output terminals disposed at the other diametrically opposite ones of the four connection points for taking out an output signal.

In a preferred embodiment, each of the first and second soft magnetic metallic elements comprises a plurality of soft magnetic metallic strips extending in a third direction and equi-spacedly arranged in parallel with each other, and non-magnetic conductor pieces connecting adjacent ones of the magnetic metallic strips, respectively, to form a series connection of the soft magnetic metallic strips and the non-conductor metallic pieces alternately connected in the zigzag shape.

In another preferred embodiment, the magnetic sensor further comprises an insulator substrate, wherein each of the first and second non-magnetic electro-conductive elements, each of the soft magnetic metallic strips, and the non-magnetic metallic pieces are thin films formed on the insulator substrate.

The magnetic sensor may comprise a hard magnetic film formed on the insulator substrate, and a first interlayer film formed on the hard magnetic film, the thin films of each of the first and second non-magnetic electro-conductive elements, each of the soft magnetic metallic strips, and the non-magnetic metallic pieces being formed on the first interlayer insulator film.

The magnetic sensor may comprise a bias conductor film disposed at at least one level of the upper and the lower of the first and second soft magnetic metallic elements through an insulator layer for applying a DC bias magnetic field to the first and second soft magnetic metallic elements, the bias conductor film having opposite end terminals for receiving a DC current for exciting the DC bias magnetic field.

The magnetic sensor may comprise a protective top insulator layer having first through sixth apertures, the two input terminals being formed as first and second electrode pads exposed in the first and second apertures, the two output terminals being formed as third and fourth electrode pads exposed in the third and fourth apertures, the opposite end terminals being formed as fifth and sixth electrode pads exposed in the fifth and sixth apertures.

The magnetic sensor may comprise a second interlayer insulator film formed on the first and second non-magnetic conductive elements, the bias conductor film being a coil conductor film in a spiral shape formed on the second interlayer insulator film.

The magnetic sensor may comprises a protective top insulator layer having first through sixth apertures, the two input terminals being formed as first and second electrode pads exposed in the first and second apertures, the two output terminals being formed as third and fourth electrode pads exposed in the third and fourth apertures, the opposite end terminals being formed as fifth and sixth electrode pads exposed in the fifth and sixth apertures.

The magnetic sensor may comprises a second interlayer insulator film formed on the first and second non-magnetic conductive elements, the bias conductor film being a coil conductor film in a spiral shape formed on the second interlayer insulator film.

The coil conductor film may comprise a one-turn spiral pattern. Alternatively, the coil conductor film may comprise two one-turn spiral patterns having inner ends and outer ends, the two one-turn spiral patterns being connected to each other at their outer ends, the inner ends serving as the terminal ends.

The second direction is preferably same as the third direction. Two magnetic members with a high magnetic permeability are disposed at both outer sides of the first and second soft magnetic metallic elements in the third direction for converging fluxes of the external magnetic field onto the soft magnetic metallic elements.

In another aspect, each of the soft magnetic metallic strips has a multi-layer structure comprising soft magnetic metallic layers and at least one non-magnetic layer interposing between two of the soft magnetic metallic layers.

DESCRIPTION OF THE PREFERRED EMBODIMENTS

Prior to description of preferred embodiments of this invention, a conventional magnetic sensor will be described with reference to FIGS. 1–3.

Figure 1:
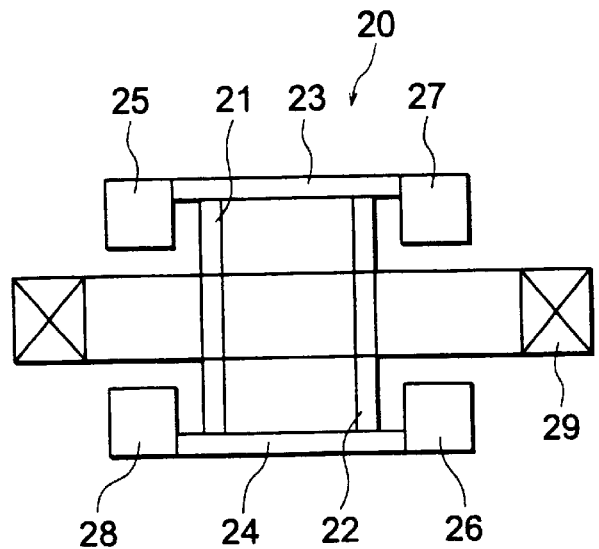
FIG. 1 is a schematic view of a conventional magnetic sensor.

Referring to FIG. 1, the conventional magnetic sensor 20 comprises an insulator substrate (not shown), first and second soft magnetic metallic film strips 21 and 22 formed on the substrate, and first and second non-magnetic conductor strips 23 and 24 formed on the substrate. The first and second soft magnetic metallic film strips 21 and 22 are disposed in parallel with each other and spaced from each other. The first and second non-magnetic conductor strips 23 and 24 are also disposed in parallel with each other but perpendicular to the first and second soft magnetic metallic film strips 21 and 22. The first non-magnetic conductor strip 23 connects between first ends of the first and second soft magnetic metallic film strips 21 and 22. The second non-magnetic conductor strip 24 connects between second ends of the first and second soft magnetic metallic film strips 21 and 22. Thus, the four strips 21–24 form a rectangle as seen in the figure. The first and second non-magnetic conductor film strips 23 and 24 have electrode pads 25–28 at their opposite ends, respectively.

The magnetic sensor 20 further comprises a ring coil 29 wound on a ring bobbin (not shown) disposed around the substrate.

Figure 2:
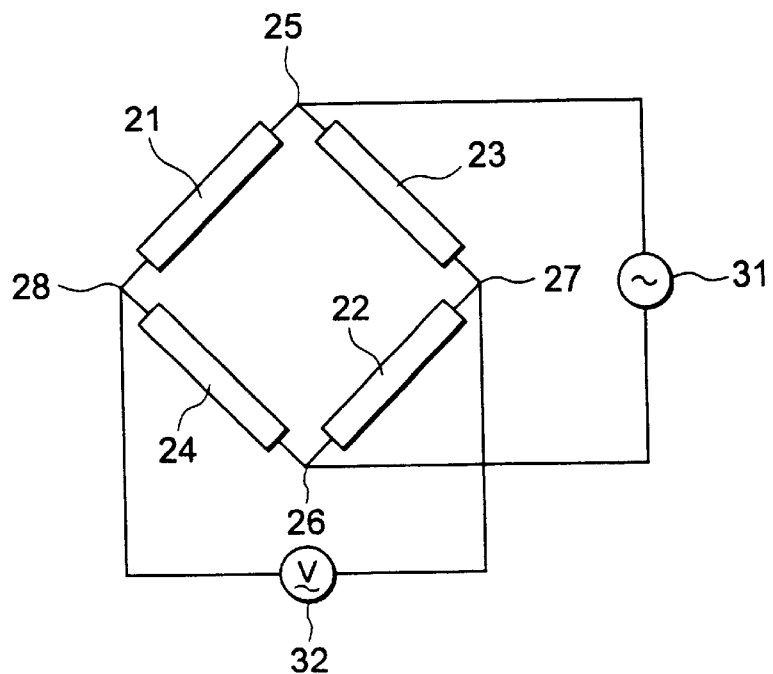
FIG. 2 is a circuit diagram of the magnetic sensor of FIG. 1.

Referring to FIG. 2, the rectangle of four strips 21–24 forms an impedance bridge circuit shown therein. The diametrically opposite two connection points or two electrode pads 25 and 26 are connected to a high frequency oscillator 31 and the other two connection points or two electrode pads 27 and 28 are connected to a voltage meter 32.

When the driving AC voltage is applied to the bridge circuit from the oscillator 31 and when the bridge circuit is exposed in an external magnetic field in parallel with the soft magnetic metallic strips 21 and 22, the skin depth of the soft magnetic metallic strips 21 and 22 for the AC current changes so that a voltage is indicated as a detection output at the voltage meter 32.

A bias DC current for the magnetic bias is applied to the coil 29 through a constant current supply or a variable current supply (not shown) from a power supply (not shown) for the oscillator 31.

The conventional magnetic sensor has problems as described in the Background of the Invention.

Figure 3:
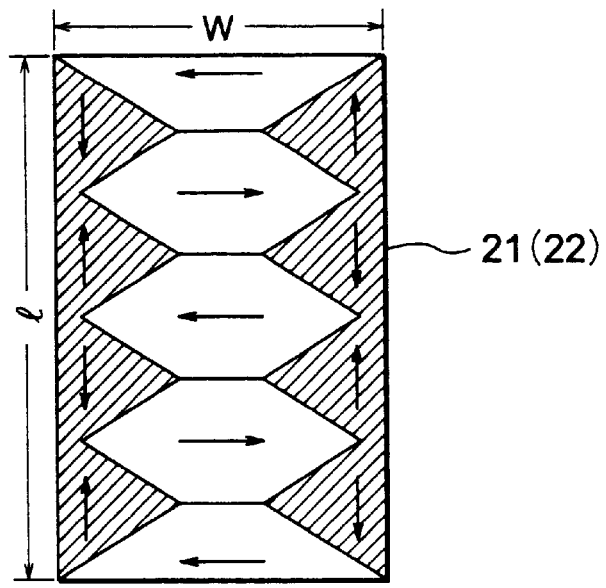
FIG. 3 is a plan view of a soft magnetic metallic film illustrating returning magnetic domains.

Referring to FIG. 3, the soft magnetic metallic film strip 21 or 22 is usually heat-treated to have an easy axis or an axis of easy magnetization in a width direction of the strip. The soft magnetic metallic film strips 21 or 22 has a central area or domain sensitive to an external magnetic field (shown at a white area in the figure) and returning or refluxing domains at opposite side edges of the strip in its width direction (shown at hatched areas in the figure). Thus, a plurality of circulating magnetic loops are formed to be arranged in the direction of a length (I) of the strip 21 or 22.

When the width (W) of the strip 21 or 22 is reduced in size, the area of the returning domains are increased comparing with the magnetic sensitive area, so that the magnetic sensitivity is degraded. When the thickness (t) of the strip 21 or 22 is decreased, the area of the returning domains is reduced. In the case, the frequency of the driving AC voltage becomes higher because it is determined by the thickness of the strip 21 and 22.

Now, description will be made as to preferred embodiments of this invention with reference to the drawings.

A feature of the magnetic sensor of this invention is that the soft magnetic metallic element is formed in a zigzag shape.

Figure 4:
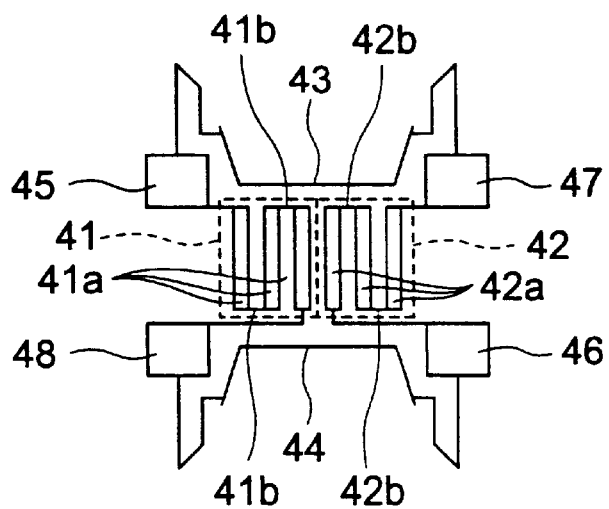
FIG. 4 is a plan view of a magnetic sensing bridge circuit used in a magnetic sensor according to an embodiment of this invention.

Referring to FIG. 4, an example of an impedance bridge circuit used in the magnetic sensor according to one embodiment of this invention comprises first and second soft magnetic metallic elements 41 and 42, and first and second non-magnetic electro-conductive elements 43 and 44. Those elements 41–44 are disposed in the four arms of the impedance bridge circuit, respectively. The impedance bridge circuit has four electrode pads 45–48 at four connection points between four arms, respectively.

The non-magnetic conductor elements 43 and 44 generally extend in a first direction and arranged in parallel with each other. The first and second soft magnetic metallic elements 41 and 42 extend in a second direction perpendicular to the first direction and arranged in parallel with each other to connect the first and second non-magnetic electro-conductive elements 43 and 44 to each other at opposite ends, respectively. Thus, the first and second non-magnetic elements 43 and 44 and the first and second soft magnetic metallic elements 41 and 42 form a rectangle having four connection points at the opposite ends. Two electrode pads 45 and 46 which are disposed at two diametrically opposite ones of the four connection points provide input terminals for applying an AC input voltage for driving the sensor. While, the other two electrode pads 47 and 48 which are disposed at the other diametrically opposite ones of the four connection points provide output terminals for taking out an output signal.

Each of the first and second soft magnetic metallic elements 41 and 42 are formed in the zigzag shape. The first and second soft magnetic metallic elements 41 and 42 comprise a plurality of soft magnetic metallic strips 41a and 42a extending in a third direction and equi-spacedly arranged in parallel with each other. The third direction is preferably equal to the second direction as shown in the figure. Non-magnetic conductor pieces 41b and 42b connect adjacent ones of the soft magnetic metallic strips 41a and 42a, respectively. Thus, the soft magnetic metallic strips 41a and 42a and the non-conductor metallic pieces 41b and 42b are alternately connected to form a series connection in the zigzag form.

Each of the soft magnetic metallic elements 41 and 42 can have an increased impedance without significant increase of the space therefor. Further, the driving AC voltage can be increased without increase of AC current Therefore, it is possible to improve the magnetic sensitivity without increase of the space and of current consumption.

Figure 5:
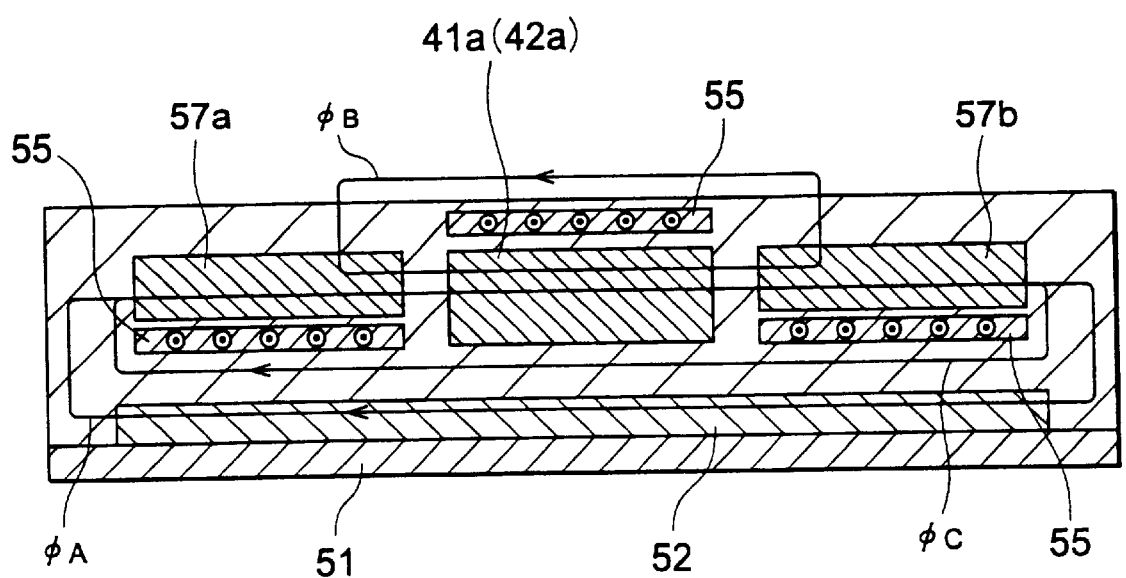
FIG. 5 is a sectional view of a magnetic sensing module using the magnetic sensing bridge circuit of FIG. 4, taken along a direction of a length of a soft magnetic metallic strip.
Figure 6:
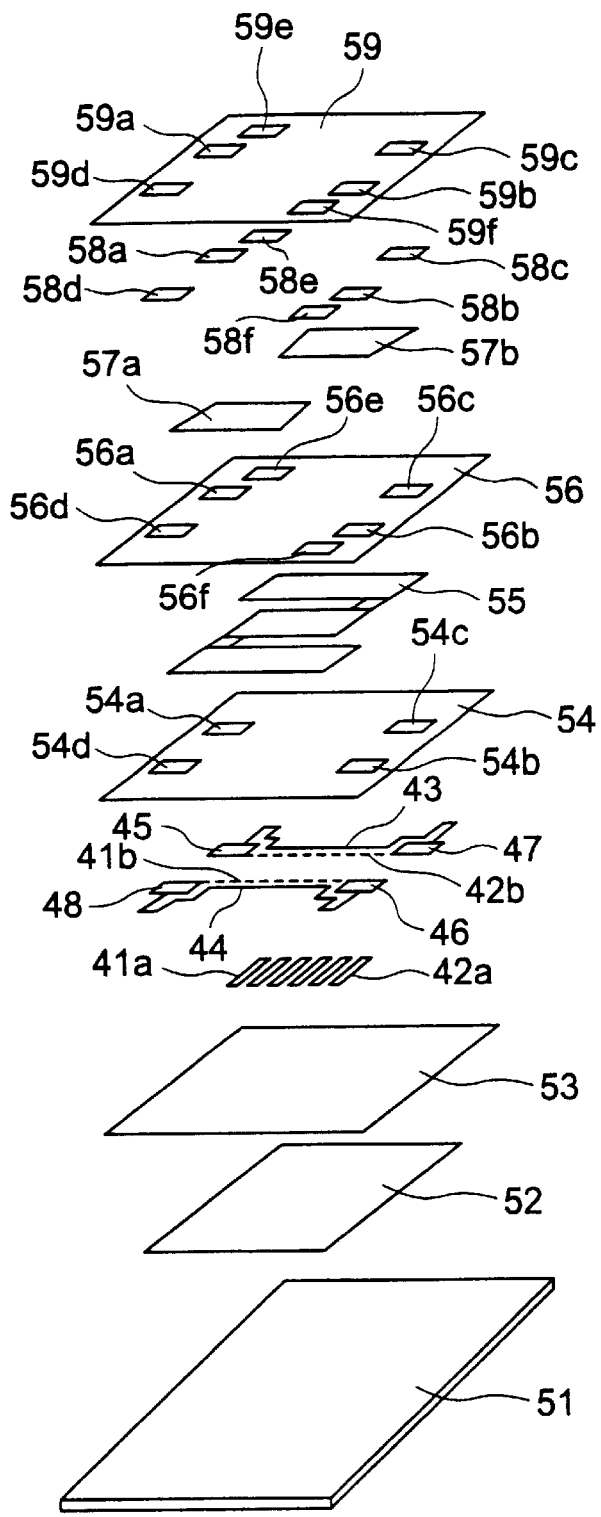
FIG. 6 is an exploded perspective view of the magnetic sensing module of FIG. 5.

Referring to FIGS. 5 and 6, description will be made as to a module of a magnetic sensor using the impedance bridge of FIG 4.

The magnetic sensor module comprises an insulator substrate 51. The first and second non-magnetic electro-conducive elements 43 and 44, the soft magnetic metallic strips 41a and 42a, and the non-magnetic metallic pieces 41b and 42b are all formed in thin films formed on the insulator substrate 51.

In detail, the module further comprises a hard magnetic film 52 formed on the insulator substrate 51, and a first interlayer insulator film 53 formed on the hard magnetic film 52. Thin films of the first and second non-magnetic electro-conductive elements 43 and 44, of the sad magnetic metallic strips 41a and 42a, and of the non-magnetic metallic pieces 41b and 42b are formed on the first interlayer insulator film 53. Thin film electrode pads 45–48 are also formed on the first interlayer insulator 53.

A second interlayer insulator 54 are formed on those thin films 41a–48 and over the first interlayer insulator 53. The second interlayer insulator 54 has four apertures 54a–64d for exposing the electrode pads 45–48 therethrough, respectively.

A coil conductor film 55 of a spiral shape is formed as a bias conductor film on the second interlayer insulator film 54. The spiral coil 56 comprises two spiral pieces of extending in a same turning direction. The two spiral pieces are connected to each other at their extending ends. The other ends of the two spiral pieces provide terminals of the spiral coil 55.

A third interlayer insulator film 56 is formed an the spiral coil and over the second interlayer insulator film 54. The third interlayer insulator film 56 has four apertures 56a–56d for exposing the electrode pads 45–48 through apertures 54a–54d and additionally two apertures 56e and 56 for exposing opposite terminals of the spiral coil 55.

On the third interlayer insulator film 56, two soft magnetic films 57a and 57b with a high magnetic permeability are formed for converging the external magnetic field to the soft magnetic metallic pieces 41a and 42a. The soft magnetic films 57a and 57b are disposed at both outer sides of the impedance bridge circuit in the third direction or the extending direction of the soft magnetic metallic pieces 41a and 42a Further, electrode films 56a–58f are formed in the apertures 56a–56f in the third interlayer insulator film 56 for providing take-out electrodes for the bridge circuit and the spiral coil.

A top protective film 59 is finally formed on the soft magnetic films 57a and 57b and over the third interlayer insulator film 56. The top protective film 59 has six apertures 59a–59f for exposing the take-out electrodes 58a–58f, respectively.

Electrode films 58a–58f are formed on electrode pads 45–48 and opposite terminal ends of spiral coil 55. The take-out electrodes are made thicker. Therefore, the module is protected from a downward forth upon wire-bonding onto the take-out electrodes.

In use, a high frequency oscillator (31 in FIG. 2) is connected to electrode pads 45 and 46 or the take-out electrodes 58a and 58b and a voltage meter (32 in FIG. 2) is also connected to electrode pads 47 and 48 or take-out electrodes 58c and 58d. A DC bias current is applied to the spiral coil 55 through erode pads 58e and 58f so as to magnetically bias the soft magnetic metallic strips 41a and 42a.

The hard magnetic film 52 is for priding a fixed magnetic bias to the soft magnetic metallic strips 41a and 41b as shown by arrow φA in FIG. 5. The hard magnetic film 52 can be disposed at a different stacked level in the stack of the module. If the fixed magnetic bias is not required, the hard magnetic film 52 is omitted.

Figure 7:
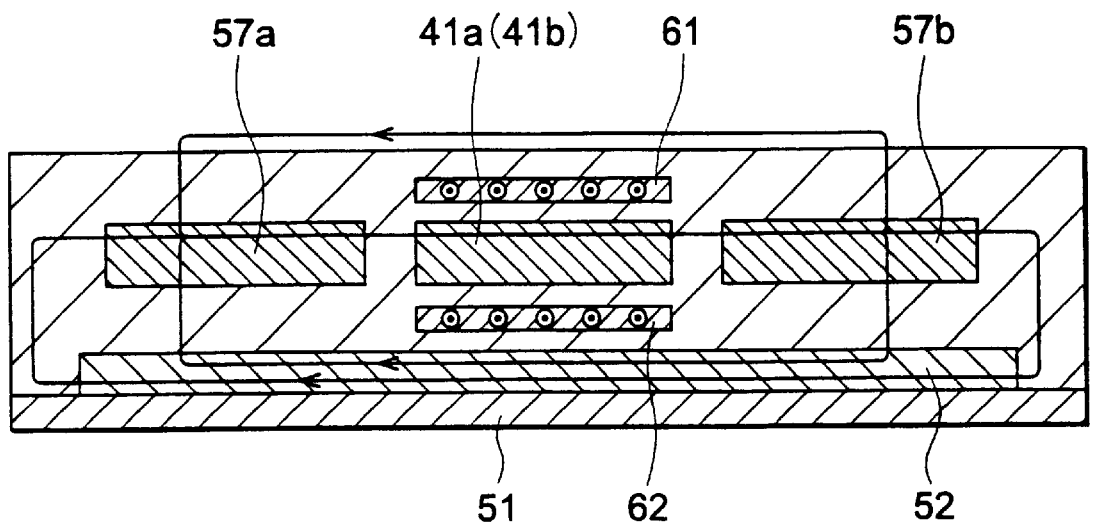
FIG. 7 is a sectional view of a magnetic sensing module according to another embodiment of this invention, similar to FIG. 5.

The spiral coil 55 is for providing a variable magnetic bias to the soft magnetic metallic strips 41a and 42a as shown by arrows φB and φC in FIG. 5. Alternatively, two conductor films 61 and 62 can be disposed above and below the soft magnetic metallic pieces 41a and 42a for the variable magnetic bias, as shown in FIG. 7. One of conductors can be omitted.

Figure 8:
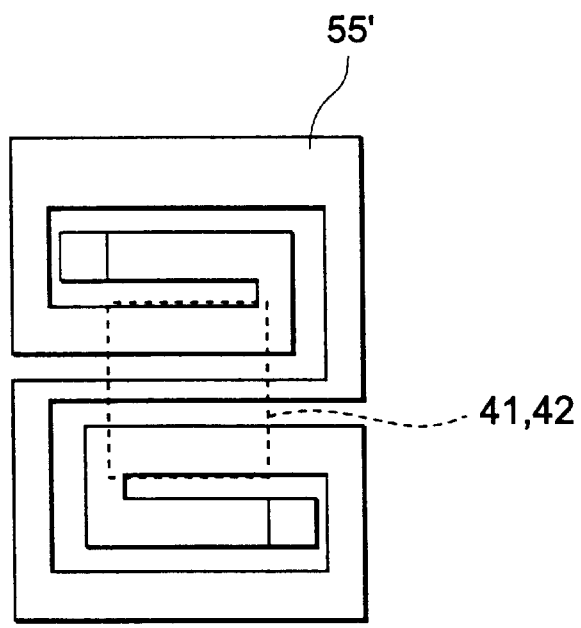
FIG. 8 s a plan view illustrating a different example of a spiral coil for a variable magnetic bias.

Further, as shown in FIG. 8, spiral coil 55' can comprises two spiral pieces each of which has two spiral turns. Each of the spiral pieces may have further increased spiral turns.

The spiral coil and conductor films can be omitted if the variable magnetic bias is not required.

Returning to FIG. 4, conductor pieces 41b and 42b in soft magnetic metallic elements 41 and 42 can be made of soft magnetic metallic pieces. In the case, each of the soft magnetic metallic elements is entirely made of soft magnetic metallic material into a zigzag form. However, it is afraid that magnetic flux of the external magnetic field is deflected at the pieces 41b and 42b so that the external magnetic field is not equally applied to the whole of the soft magnetic strips 41a and 41b. Therefore, it is desired that conductor pieces 41b and 42b are made of non-magnetic conductor material.

Figure 9:
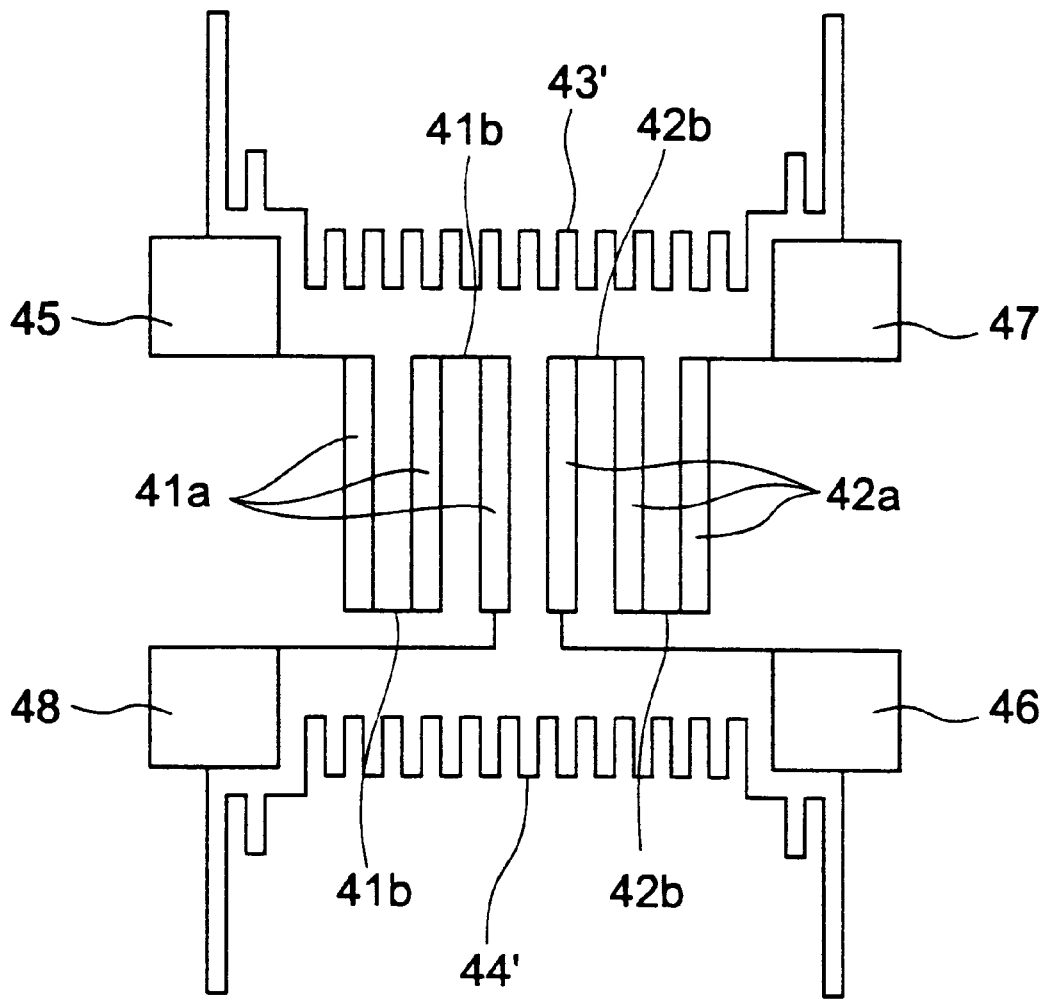
FIG. 9 is a plan view of a magnetic sensing bridge circuit according to another embodiment of this invention.

Referring to FIG. 9, non-magnetic conductor elements can be formed in a zigzag shape, as shown at 43' and 44', so as to make the non-magnetic conductor elements 43 and 44 have impedance equal to soft magnetic metallic elements 41 and 42.

As material for the soft magnetic metallic strips, it is possible to use soft magnetic material with high magnetic permeability and electro-conductivity such as FeCoSiB, CoNbZr, CoTaZr, or NiFe. The thickness of the soft magnetic metallic strips is, for example, 3 $\mu$m or 5 $\mu$m. The thickness of 5 $\mu$m is more appropriate for 10 MHz of a frequency of the driving AC voltage.

As material for the non-magnetic conductor films and pieces, there is a metal such as Ti, Cu, Cr, Au, Ag, or Pt The thickness of the non-magnetic conductor film should be selected so hat it has impedance equal to that of the soft magnetic metallic element.

The following Table demonstrates properties of an example of the magnetic sensor shown FIGS. 4–6 in comparison with a conventional one shown in FIG. 1. FeCoSiB and Ag were used for the soft magnetic metallic material and non-magnetic conductor material, respectively. The thickness of FeCoSiB film was 5 $\mu$m.

TABLE

|  | Conventional | Invention |
|---|---|---|
| Magnetic sensitivity | 100 Volts/Tesla | 300 volts/Tesla |
| Input Impedance | 25Ω | 80Ω |
| Magnetic Bias Efficiency |  |  |
| Fixed Bias | 50 Amperes/Tesla | 0 Amperes/Tesla |
| Variable Bias |  |  |
| Spiral | 50 Amperes/Tesla | 15 Amperes/Tesla |
| Upper Conductor | 50 Amperes/Tesla | 40 Amperes/Tesla |

Figure 10:
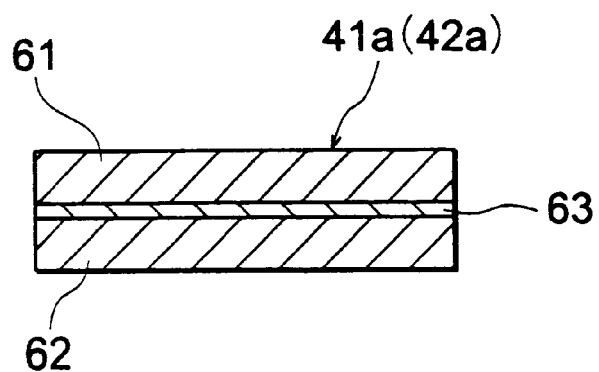
FIG. 10 is a sectional view of a multi-layered soft magnetic metallic film strip used in the magnetic sensor according to this invention.
Figure 11:
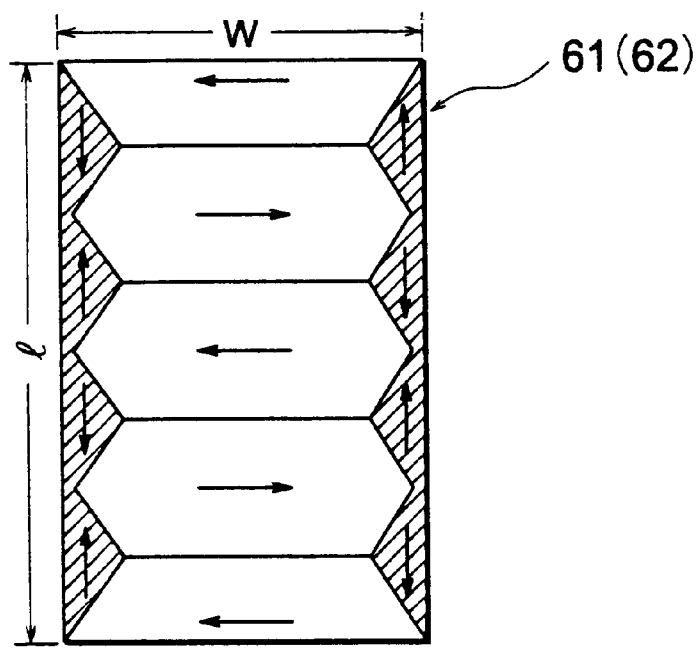
FIG. 11 is a schematic plan view of a soft magnetic metallic layer in the strip of FIG. 10 illustrating the returning magnetic domains.

Referring to FIG. 10, each of the soft magnetic metallic strips 41a and 42a can be formed with a multi-layered structure which comprises two soft magnetic layers 61 and 62 and a non-magnetic layer 63 sandwiched by the soft magnetic layers 61 and 62. The multi-layered structure has a thickness sufficient to insure the desired frequency of the driving AC voltage. On the other hand, the soft magnetic layers 61 and 62 can be made thinner so that the total area of the returning domains can be reduced as shown at hatched region in FIG. 11. Therefore, the width (W) of the soft magnetic metallic element can be reduced in size without degradation of the magnetic sensitivity.

Although a three-layered structure is shown in FIG. 10, any other structure having an increased number of layers can be realized with soft magnetic metallic layers and non-magnetic layers alternately stacked.

Each of the soft magnetic layers should have a thickness equal to or more of 0.5 times of the skin depth for detecting variation of the magnetic permeability of the soft magnetic metallic layers due to the external magnetic field applied thereto.

The non-magnetic layer can be made of conductive material such as Cu, Ag, Au, Pt or the like. Alternatively, it can also be made of insulator material such as $SiO_2$.

As an example, the total thickness of the multi-layered soft magnetic metallic element 61–63 has a thickness of 5 $\mu$m and the non-magnetic layer 63 has a thickness of 1 $\mu$m or less.

What is claimed is:

1. A magnetic sensor comprising an impedance bridge circuit, said impedance bridge circuit comprising:

first and second non-magnetic electro-conductive elements extending in a first direction and arranged in parallel with each other;

first and second soft magnetic metallic elements extending in a second direction generally perpendicular to said first direction and arranged in parallel with each other to connect said first and second non-magnetic electro-conductive elements to each other at opposite ends, respectively, so that said first and second non-magnetic elements and said first and second soft magnetic elements form a rectangle having four connection points at said opposite ends;

two input terminals disposed at two diametrically opposite ones of said four connection points for applying an AC input voltage for driving the sensor;

two output terminals disposed at the other diametrically opposite ones of said four connection points for outputting an out an output signal;

an insulator substrate;

a hard magnetic film formed on said insulator substrate; and a first interlayer insulator film formed on said hard magnetic film;

wherein each of said first and second soft magnetic metallic elements has an impedance that varies by exposure to an external magnetic field to be sensed;

wherein each of said first and second soft magnetic metallic elements comprises a plurality of soft magnetic metallic strips extending in a third direction and equi-spacedly arranged in parallel with each other, and non-magnetic conductor pieces connecting adjacent ones of said magnetic metallic strips, respectively, to form a series connection of said soft magnetic metallic strips and said non-conductor metallic pieces alternately connected in a zigzag shape; and wherein each of said first and second non-magnetic electro-conductive elements, each of said soft magnetic metallic strips, and said non-magnetic metallic pieces comprise thin films formed on said first interlayer insulator film.

2. A magnetic sensor comprising an impedance bridge circuit, said impedance bridge circuit comprising:

first and second non-magnetic electro-conductive elements extending in a first direction and arranged in parallel with each other;

first and second soft magnetic metallic elements extending in a second direction generally perpendicular to said first direction and arranged in parallel with each other to connect said first and second non-magnetic electro-conductive elements to each other at opposite ends, respectively, so that said first and second non-magnetic elements and said first and second soft magnetic elements form a rectangle having four connection points at said opposite ends;

two input terminals disposed at two diametrically opposite ones of said four connection points for applying an AC input voltage for driving the sensor;

two output terminals disposed at the other diametrically opposite ones of said four connection points for outputting an out an output signal; and a bias conductor film disposed at at least one level of an upper and a lower of said first and second soft magnetic metallic elements through an insulator layer for applying a DC bias magnetic field to said first and second soft magnetic metallic elements, said bias conductor film having opposite end terminals for receiving a DC current for exciting said DC bias magnetic field;

wherein each of said first and second soft magnetic metallic elements has an impedance that varies by exposure to an external magnetic field to be sensed; and wherein each of said first and second soft magnetic metallic elements comprises a plurality of soft magnetic metallic strips extending in a third direction and equi-spacedly arranged in parallel with each other, and non-magnetic conductor pieces connecting adjacent ones of said magnetic metallic strips, respectively, to form a series connection of said soft magnetic metallic strips and said non-conductor metallic pieces alternately connected in a zigzag shape.

3. A magnetic sensor as claimed in claim 2, further comprising a protective top insulator having first through sixth apertures, wherein said two input terminals are formed as first and second electrode pads exposed in said first and second apertures, said two output terminals are formed as third and fourth electrode pads exposed in said third and fourth apertures, and said opposite end terminals of said bias conductor film are formed as fifth and sixth electrode pads exposed in said fifth and sixth apertures.

4. A magnetic sensor as claimed in claim 3, further comprising a second interlayer insulator film formed on said first and second non-magnetic conductive elements, wherein said bias conductor film comprises a coil conductor film in a spiral shape formed on said second interlayer insulator film.

5. A magnetic sensor as claimed in claim 4, wherein said coil conductor film has a one-turn spiral pattern shape.

6. A magnetic sensor as claimed in claim 4, wherein said coil conductor film comprises two spiral-pattern sections, and said two spiral-pattern sections have one or more spiral turns and having inner ends and outer ends, and wherein said two spiral-pattern sections are connected to each other at their outer ends, and said inner ends serve as said end terminals.

7. A magnetic sensor as claimed in claim 2, further comprising an insulator substrate, wherein each of said first and second non-magnetic electro-conductive elements, each of said soft magnetic metallic strips, and said non-magnetic metallic pieces comprise thin films formed on said insulator substrate.

8. A magnetic sensor as claimed in claim 7, further comprising a protective top insulator having first through sixth apertures, wherein said two input terminals are formed as first and second electrode pads exposed in said first and second apertures, said two output terminals are formed as third and fourth electrode pads exposed in said third and fourth apertures, and said opposite end terminals of said bias conductor film are formed as fifth and sixth electrode pads exposed in said fifth and sixth apertures.

9. A magnetic sensor as claimed in claim 8, further comprising a second interlayer insulator film formed on said first and second non-magnetic conductive elements, wherein said bias conductor film comprises a coil conductor film in a spiral shape formed on said second interlayer insulator film.

10. A magnetic sensor as claimed in claim 9, wherein said coil conductor film has a one-turn spiral pattern shape.

11. A magnetic sensor as claimed in claim 9, wherein said coil conductor film comprises two spiral-pattern sections, and said two spiral-pattern sections have one or more spiral turns and having inner ends and outer ends, and wherein said two spiral-pattern sections are connected to each other at their outer ends, and said inner ends serve as said end terminals.

12. A magnetic sensor comprising an impedance bridge circuit, said impedance bridge circuit comprising:

first and second non-magnetic electro-conductive elements extending in a first direction and arranged in parallel with each other;

first and second soft magnetic metallic elements extending in a second direction generally perpendicular to said first direction and arranged in parallel with each other to connect said first and second non-magnetic electro-conductive elements to each other at opposite ends, respectively, so that said first and second non-magnetic elements and said first and second soft magnetic elements form a rectangle having four connection points at said opposite ends;

two input terminals disposed at two diametrically opposite ones of said four connection points for applying an AC input voltage for driving the sensor;

two output terminals disposed at the other diametrically opposite ones of said four connection points for outputting an out an output signal; and an insulator substrate;

wherein each of said first and second soft magnetic metallic elements has an impedance that varies by exposure to an external magnetic field to be sensed;

wherein each of said first and second soft magnetic metallic elements comprises a plurality of soft magnetic metallic strips extending in a third direction and equi-spacedly arranged in parallel with each other, and non-magnetic conductor pieces connecting adjacent ones of said magnetic metallic strips, respectively, to form a series connection of said soft magnetic metallic strips and said non-conductor metallic pieces alternately connected in a zigzag shape;

wherein each of said first and second non-magnetic electro-conductive elements, each of said soft magnetic metallic strips, and said non-magnetic metallic pieces comprise thin films formed on said insulator substrate; and wherein said second direction is the same as said third direction, and two magnetic members with a high magnetic permeability are disposed at both outer sides of said first and second soft magnetic elements in said third direction for converging fluxes of said external magnetic field to be sensed onto said soft magnetic metallic elements.

13. A magnetic sensor comprising an impedance bridge circuit, said impedance bridge circuit comprising:

first and second non-magnetic electro-conductive elements extending in a first direction and arranged in parallel with each other;

first and second soft magnetic metallic elements extending in a second direction generally perpendicular to said first direction and arranged in parallel with each other to connect said first and second non-magnetic electro-conductive elements to each other at opposite ends, respectively, so that said first and second non-magnetic elements and said first and second soft magnetic elements form a rectangle having four connection points at said opposite ends;

two input terminals disposed at two diametrically opposite ones of said four connection points for applying an AC input voltage for driving the sensor;

two output terminals disposed at the other diametrically opposite ones of said four connection points for outputting an out an output signal; and an insulator substrate;

wherein each of said first and second soft magnetic metallic elements has an impedance that varies by exposure to an external magnetic field to be sensed;

wherein each of said first and second soft magnetic metallic elements comprises a plurality of soft magnetic metallic strips extending in a third direction and equi-spacedly arranged in parallel with each other, and non-magnetic conductor pieces connecting adjacent ones of said magnetic metallic strips, respectively, to form a series connection of said soft magnetic metallic strips and said non-conductor metallic pieces alternately connected in a zigzag shape;

wherein each of said first and second non-magnetic electro-conductive elements, each of said soft magnetic metallic strips, and said non-magnetic metallic pieces comprise thin films formed on said insulator substrate; and wherein each of said soft magnetic metallic strips has a multi-layer structure comprising soft magnetic metallic layers and at least one non-magnetic layer interposed between two of said soft magnetic metallic layers.

14. A magnetic sensor comprising an impedance bridge circuit, said impedance bridge circuit comprising:

first and second non-magnetic electro-conductive elements extending in a first direction and arranged in parallel with each other;

first and second soft magnetic metallic elements extending in a second direction generally perpendicular to said first direction and arranged in parallel with each other to connect said first and second non-magnetic electro-conductive elements to each other at opposite ends, respectively, so that said first and second non-magnetic elements and said first and second soft magnetic elements form a rectangle having four connection points at said opposite ends;

two input terminals disposed at two diametrically opposite ones of said four connection points for applying an AC input voltage for driving the sensor;

two output terminals disposed at the other diametrically opposite ones of said four connection points for outputting an out an output signal; and an insulator substrate;

wherein each of said first and second soft magnetic metallic elements has an impedance that varies by exposure to an external magnetic field to be sensed;

wherein each of said first and second soft magnetic metallic elements comprises a plurality of soft magnetic metallic strips extending in a third direction and equi-spacedly arranged in parallel with each other, and non-magnetic conductor pieces connecting adjacent ones of said magnetic metallic strips, respectively, to form a series connection of said soft magnetic metallic strips and said non-conductor metallic pieces alternately connected in a zigzag shape;

wherein each of said first and second non-magnetic electro-conductive elements, each of said soft magnetic metallic strips, and said non-magnetic metallic pieces comprise thin films formed on said insulator substrate; and wherein each of said first and second non-magnetic electro-conductive elements are formed in a zigzag shape.

* * * * *